United States Patent
Mandal et al.

(10) Patent No.: US 10,249,590 B2
(45) Date of Patent: Apr. 2, 2019

(54) STACKED DIES USING ONE OR MORE INTERPOSERS

(71) Applicant: GLOBALFOUNDRIES INC., Grand Cayman (KY)

(72) Inventors: Sudeep Mandal, Bangalore (IN); Sebastian T. Ventrone, South Burlington, VT (US); Richard S. Graf, Gray, ME (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/614,850

(22) Filed: Jun. 6, 2017

(65) Prior Publication Data

US 2018/0350684 A1   Dec. 6, 2018

(51) Int. Cl.

| | |
|---|---|
| *H01L 23/12* | (2006.01) |
| *H01L 23/52* | (2006.01) |
| *H01L 29/40* | (2006.01) |
| *H01L 23/00* | (2006.01) |
| *H01L 23/48* | (2006.01) |
| *H01L 21/56* | (2006.01) |
| *H01L 25/065* | (2006.01) |

(52) U.S. Cl.
CPC .............. *H01L 24/26* (2013.01); *H01L 21/56* (2013.01); *H01L 23/481* (2013.01); *H01L 24/10* (2013.01); *H01L 24/97* (2013.01); *H01L 25/0657* (2013.01)

(58) Field of Classification Search
CPC . H01L 2224/13025; H01L 2224/14515; H01L 2224/16146; H01L 2224/17181; H01L 2225/06513; H01L 2225/06527; H01L 2225/06541; H01L 2225/06544; H01L 2225/06565; H01L 24/13; H01L 24/14; H01L 24/16
See application file for complete search history.

(56) References Cited

U.S. PATENT DOCUMENTS

| | | | |
|---|---|---|---|
| 8,310,841 B2 | 11/2012 | Foster, Sr. et al. | |
| 8,455,270 B2 | 6/2013 | Farooq et al. | |
| 8,604,593 B2 | 12/2013 | Schuetz | |
| 9,029,234 B2 | 5/2015 | Safran et al. | |
| 2014/0102772 A1* | 4/2014 | Chen ..................... | H05K 1/113 174/255 |
| 2015/0084689 A1* | 3/2015 | Lee ....................... | G11C 29/025 327/565 |

* cited by examiner

*Primary Examiner* — Meiya Li
(74) *Attorney, Agent, or Firm* — David Cain; Andrew M. Calderon; Roberts Mlotkowski Safran Cole & Calderon, P.C.

(57) ABSTRACT

The present disclosure generally relates to semiconductor structures and, more particularly, to stacked dies using one or more interposers and methods of manufacture. The structure includes: at least one die comprising a plurality of via interconnects, the plurality of via interconnects comprising at least one functional via interconnect, one defective via interconnect and one redundant functional via interconnect to compensate for the one defective via interconnect; and an interposer which includes interconnects that aligns to and electrically connects the at least one functional via interconnect and the redundant functional via interconnect of different dies when the interposer is oriented in a predetermined orientation.

20 Claims, 7 Drawing Sheets

| Die | Classification | Defect Location | Redundancy Location | Interposer | Rotation |
|---|---|---|---|---|---|
| 1 | KGD1 | Regions 1, 3 and 5 | Regions 12, 15 and 18 | 1 | 0° |
| 2 | KGD2 | Regions 2, 4 and 5 | Regions 9, 11 and 12 | 1 | 180° |
| 3 | KGD3 | Regions 1, 3 and 4 | Regions 13, 16 and 18 | 2 | 0° |
| 4 | KGD4 | Regions 2, 3 and 5 | Regions 5, 7 and 10 | 4 | 90° |
| . | . | . | . | . | . |
| . | . | . | . | . | . |
| . | . | . | . | . | . |
| n | n | n | n | n | n |

FIG. 5

STACKED DIES USING ONE OR MORE INTERPOSERS

FIELD OF THE INVENTION

The present disclosure generally relates to semiconductor structures and, more particularly, to stacked dies using one or more interposers and methods of manufacture.

BACKGROUND

Three dimensional (3D) integrated circuit (IC) technology provides many benefits, such as a small form factor. The 3D integrated circuit requires a stacked configuration consisting of a die to die (D2D) bonding. In D2D bonding techniques, the interconnects of each of the separate integrated circuits (dies) within the stack must be aligned and in electrical connection for the stack to be operable. To this end, only non-defective dies, i.e., dies with functional electrical connections, can be used in the stacked configuration to ensure the proper functionality and operation of the 3D stack. Accordingly, defective dies, such as dies with defective via interconnects, must be discarded thereby decreasing the overall yield.

SUMMARY

In an aspect of the disclosure, a structure comprises: at least one die comprising a plurality of via interconnects, the plurality of via interconnects comprising at least one functional via interconnect, one defective via interconnect and one redundant functional via interconnect to compensate for the one defective via interconnect; and an interposer which includes interconnects that aligns to and electrically connects the at least one functional via interconnect and the redundant functional via interconnect of different dies when the interposer is oriented in a predetermined orientation.

In an aspect of the disclosure, a structure comprises: a stack of dies comprising: a first die comprising at least one functional via interconnect; and a second die comprising at least one defective via interconnect which is in alignment with the at least one functional via interconnect and at least one functionally equivalent redundant via interconnect in misalignment to the at least one functional via interconnect of the first die; and an interposer of a plurality of interposers comprising electrical interconnections coinciding with the least one functional via interconnect of the first die and the at least one functionally equivalent redundant via interconnect of the second die, the interposer being positioned between the first die and the second die such that the electrical interconnections align with and provide electrical contact with the at least one functional via interconnect and the at least one functionally equivalent redundant via interconnect.

In an aspect of the disclosure, a method for stacking dies comprises: testing dies to determine a pattern and a location of defective though silicon vias (TSVs); generating a map illustrating the pattern and the location of the defective TSVs; binning the dies together based on a commonality of the defects; designing multiple interposers to compensate for the defective TSVs of at least two dies such that at least one interposer of the multiple interposers includes connections which will align with at least one functional via interconnect of a first die and at least one functional redundant via interconnect of a second die, in a stacked configuration; selecting the first die with the functional via interconnect and the second die with the functional redundant via inter- connect; selecting an interposer from the multiple interposers which matches and electrically connects the functional via interconnect of the first die with the functional redundant via interconnect of the second die; and stacking the selected interposer, the first die and the second die into a stack and bonding them together.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 5 illustrates an exemplary look-up table detailing information for dies and interposers in accordance with aspects of the present disclosure.

DETAILED DESCRIPTION

The present disclosure generally relates to semiconductor structures and, more particularly, to stacked dies using one or more interposers and methods of manufacture. In embodiments, the present disclosure improves overall yields in die to die (D2D) stacks by utilizing defective dies which would otherwise be discarded in conventional architectures and processes. Accordingly and advantageously, by implementing the processes and architectures described herein, substantially more dies fabricated in a manufacturing process can be utilized in the stack regardless of defects, as compared to conventional processes.

More specifically, in accordance with embodiments described herein, partially defective dies can be utilized in a stack of dies by providing redundant via interconnects and at least one interposer within the stack of multiple dies. In embodiments, through testing and/or simulations and/or observation, defects within the dies are mapped, e.g., the locations of the defective via interconnects, with the defects being replaced with redundant via interconnects, using known ground rules. The combination of the redundant via interconnects (which are functional via interconnects) and other functional vias can be used to design interposers which are used to facilitate electrical connection between the redundant via interconnects of the partially defective dies and functional interconnect vias of other dies. In this way, utilization of previously screened out defective dies can be utilized to increase the yield of stacked dies.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
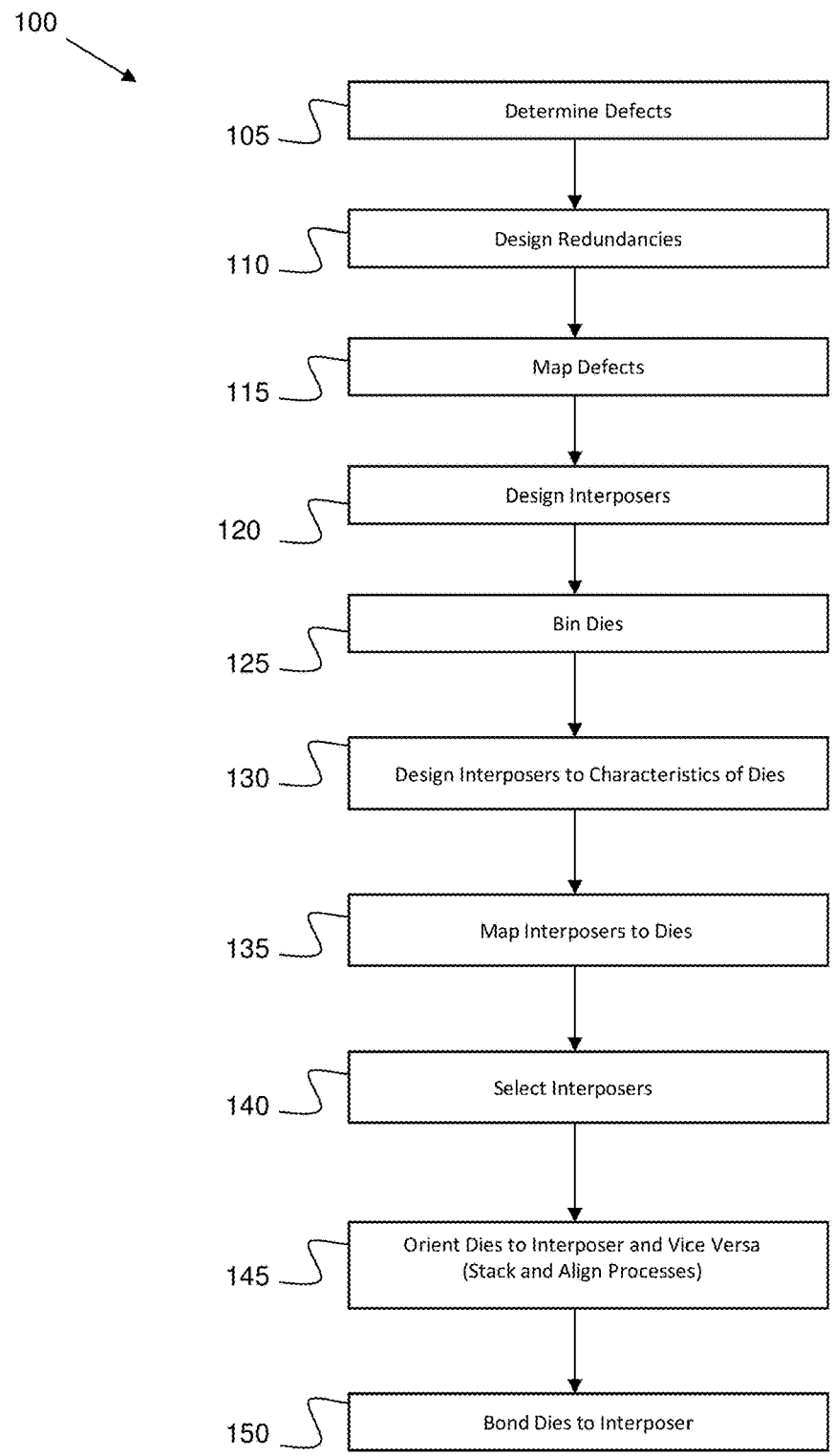
FIG. 1 shows an exemplary flowchart in accordance with aspects of the present disclosure.

FIG. 1 shows a flowchart 100 in accordance with aspects of the present disclosure. In some implementations of FIG. 1, the functions noted in the different blocks of the flowchart 100 may occur out of the order noted in FIG. 1. For example, two blocks shown in succession may, in fact, be executed substantially concurrently, or the blocks may sometimes be executed in the reverse order, depending upon the functionality involved. It will also be noted that each block of the flowchart 100, and combinations of blocks can be implemented by special purpose hardware-based systems that perform the specified functions or acts or carry out combinations of special purpose hardware and computer instructions.

Generally, FIG. 1 shows the processes of stacking dies with interposers for integrated circuit (IC) technology, i.e., a 3D IC package. As should be understood by those of skill in the art, the dies include a plurality of via interconnects, e.g., vertically oriented though silicon vias (TSVs), which are used to functionally interconnect multiple dies into a vertical stack of dies to form an integrated circuit device. During the die fabrication processes, though, defects may occur, e.g., defects in the TSVs. Although in conventional processes the defective dies are discarded due to non-functional electrical connections, the defective dies described herein are fabricated with functionally equivalent redundant via interconnects and, in combination with an interposer, can be used in the stack of dies.

More specifically, at step 105, a determination is made as to the presence, pattern and location of defects in the dies, i.e., determining the presence and location of defective TSVs. In embodiments, defect detection can occur by testing each die using conventional manufacturing testing processes or simulations, etc. At step 110, redundant vias are designed and manufactured into the dies based on known ground rules and the location of the defects and functional via interconnects. This provides an architectural redundancy of the functionally equivalent via interconnects, i.e., the redundant functional via interconnect will provide the same functionality as the defective via interconnect.

At step 115, a reference map (e.g., look-up table) of the pattern and defects is generated illustrating the locations of the defects in the TSVs, i.e., defective TSVs. In embodiments, the map or look-up table can include the location of the redundant functional via interconnects, as well as specific orientation of the dies needed to align to each of the electrical connections required in the stacked configuration, amongst other features.

At step 120, one or more interposers are designed (and manufactured) based on the different locations of the redundant via interconnects and the different locations of the functional via interconnects used at various levels of the stack and can also be designed based on the locations of defective TSVs, amongst other considerations, to compensate for the defective TSVs. In embodiments, the one or more interposers will include interconnects (metal or metal alloy interconnects) that align between and make electrical contact to at least one redundant via interconnect of the partially defective die and at least one functional via interconnect of a non-defective die or other partially defective in the stack of dies or any combination thereof. More particularly, an interposer which includes the interconnects aligns to and electrically connects the at least one functional via interconnect and the redundant functional via interconnect of different dies when the interposer is oriented in a predetermined orientation. In this way, the interposer can be used to facilitate electrical connection between defective dies, non-defective dies and any combinations thereof in the stacked configuration by matching a functional via interconnect and a redundant functional via interconnect.

Still referring to FIG. 1, at step 125, the dies are binned according to their specific characteristics. For example, dies with the same specific defect can be binned together; whereas, dies without any defects can be binned together. In addition, as should be understood by those of skill in the art, dies at different levels of the stack with same characteristics can be binned together, etc. The location of these products in each of the bins can be stored in a look-up table which may include the location of the defect or other characteristics of the dies, etc. Also, at this or other steps, the dies can be tagged with identification information as described further herein.

At step 130, the interposers can be designed to the specific dies, e.g., characteristics of the dies. For example, a first interposer can be designed for a die that has a specific defect and to another die that has no defects, at a certain level of the stacked dies. As another example, a second interposer can be designed to two dies which have different defects or same defects or any combinations thereof with functional via interconnects. In this way, the interposer can be appropriately designed to ensure that a functional, electrical connection can be made between two or more dies of the stack of dies, regardless of defects.

At step 135, specific interposers are mapped to specific dies for later selection. It should be understood that based on the location of the redundant via interconnects and functional via interconnects, two or more interposers can be mapped for joining together in order to ensure proper via interconnect alignment of the dies of the stacked dies. This mapping can be in the form of a look-up table, and can include different information including the need to rotate or orient the interposer in a different way for different dies, etc.

At step 140, the one or more specific interposers can be selected from multiple interposers and are aligned with the dies based on the mapping. In embodiments, the specifically selected interposer(s) will be selected based on, e.g., a location of the different redundant via interconnects in a defective die, a specific location of the functional via interconnects of a non-defective die or defective die, the orientation of adjacent dies, etc., to ensure proper alignment and/or connection of the interconnects of the adjacent dies in the stack of dies, amongst other combinations.

At step 145, the specifically selected interposers can be aligned, e.g., rotated or oriented in a particular orientation to ensure alignment with the interposer. Also, in embodiments, the dies can be oriented or rotated to align the functional and redundant via interconnects with the interconnects of the interposer. At step 150, the dies can be bonded to the interposer to complete at least one level of the stack of dies. This bonding can be, e.g., a reflow process for solder connections.

Figure 2:
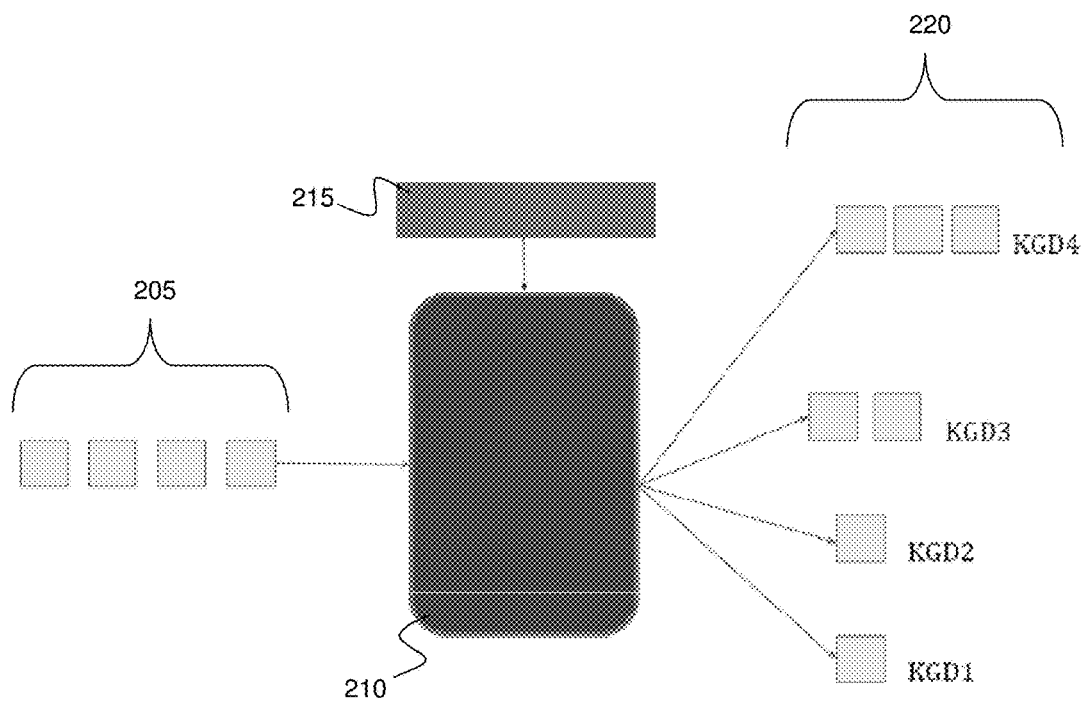
FIG. 2 illustrates an overall testing and binning process in accordance with aspects of the present disclosure.

FIG. 2 illustrates an overall testing and binning process in accordance with aspects of the present disclosure. As shown in FIG. 2, dies 205 are tested by tester 210 to find the presence of defective via interconnects, if any. It should also be recognized that the redundant via interconnects may also have defects and, hence, all of the dies are tested to ensure their viability. Testing can occur by various mechanisms.

Examples of testing performed by tester 210 include physical testing and/or simulations. Examples of simulation testing include Monte Carlo simulation and technology for computer-aided design (TCAD) simulation and property distribution, amongst other examples. It is noted that the testing, regardless if it is physical or simulation, can be performed at the die level.

In addition to tester 210, a definer 215 defines how the dies 205 are to be classified. In embodiments, the user or definer 215 defines "non-defective dies" based on predefined criterions. The dies 205 are binned into different bins 220 based on the commonality of their determined characteristics, e.g., defects. For example, dies with different characteristics can be binned in different bins, e.g., KGD1-KGD4. As a more specific example, defects in a left side of the die, if present, can be classified as KGD1, while defects in a right side of the die, if present, can be classified as KGD2.

In embodiments, the binned dies can be marked with identifying information indicating their specific characteristics, e.g., defects. The identifying information can be, e.g., a die definition marker added to each die 205. Specifically, the dies 205 can be tagged with an electronic chip ID (ECID) to serve as an identifier for stacking. In any event, the defective dies 205 are not discarded because architectural redundancy (e.g., redundant via interconnects) introduced to work around the pseudo-defective parts.

FIGS. 3A-3D show dies with different via interconnect combinations and respective fabrication processes in accordance with aspects of the present disclosure. More specifically, FIGS. 3A-3D show different arrangements of via interconnects within the dies 325, with each die 325 containing a plurality of via interconnects, i.e., one or more vias 330, 335 and 340. The dies 325 include, for example, a functionally equivalent redundant via interconnect 340 which compensates for a defective via interconnect 335. In addition, the dies 325 include an operable or functional via interconnect (non-defective) 330. In embodiments, the functionally equivalent redundant via interconnect 340 is a functional, duplicate and redundancy via interconnect used to improve overall yield of the die and, more specifically, the stacked dies. This redundancy can be determined during the testing phase in which the defects are determined and the dies are binned as shown in FIG. 2.

Figure 3A:
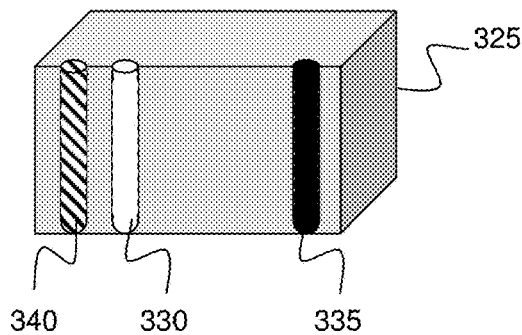
FIGS. 3A-3D show dies with different via connection combinations and respective fabrication processes in accordance with aspects of the present disclosure.
Figure 3B:
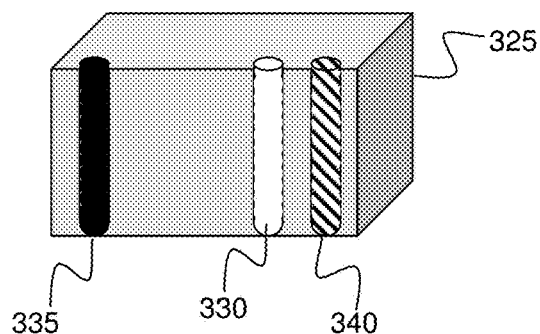
Figure 3C:
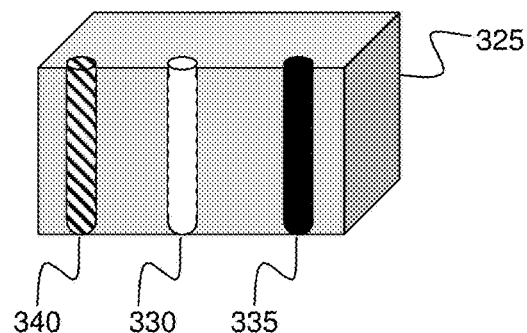
Figure 3D:
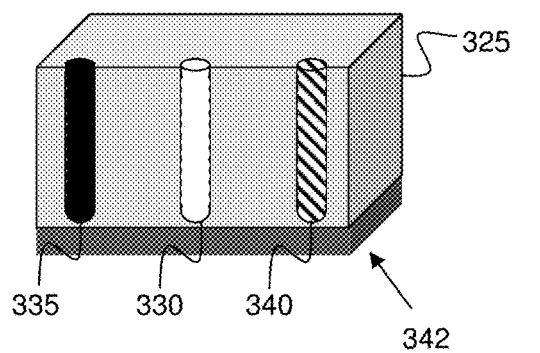
Figure 4A:
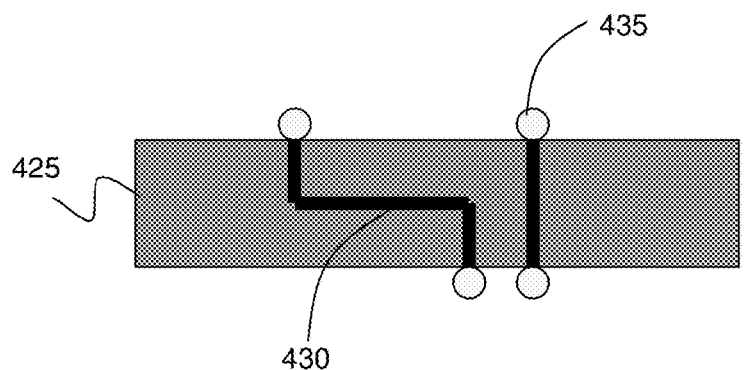
FIGS. 4A-4D illustrate various interposer configurations in accordance with aspects of the present disclosure.
Figure 4B:
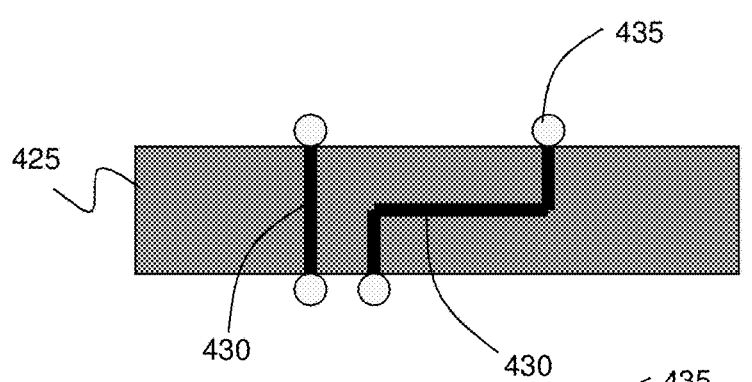
Figure 4C:
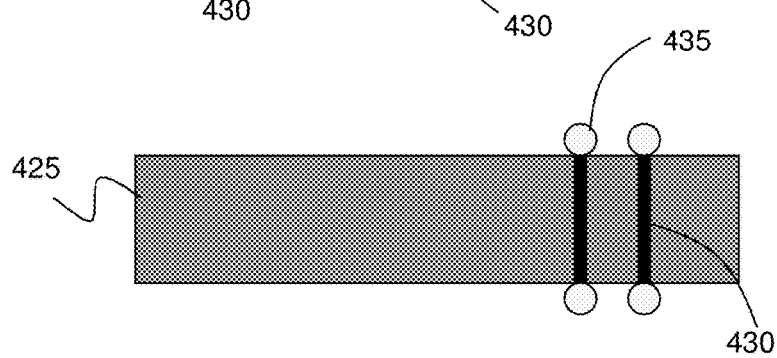
Figure 4D:
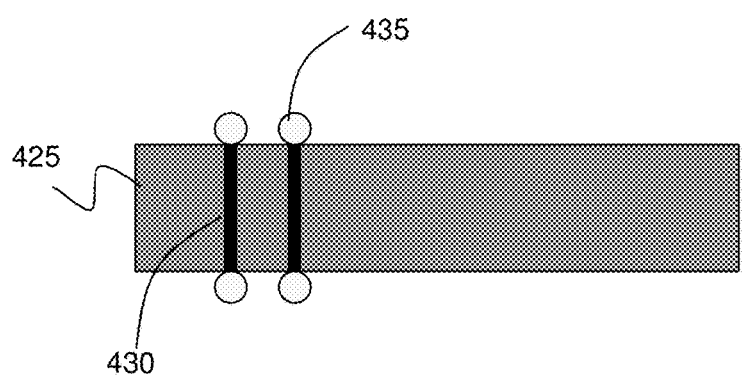

For every redundant element, i.e., functionally equivalent redundant via interconnect 340, at least two rotational orientations of the die 325 can be defined in the map. For example, FIGS. 3A, 3B and FIGS. 3C, 3D each show a rotation of the die by 180 degrees. Similarly, depending on the placement of the via interconnects and the shape of the die, etc., the rotation can be 45 degrees, 90 degrees, etc. Note that while the redundancy, i.e., functionally equivalent redundant vias 340, can be introduced for a number of elements, connections to the inputs/outputs (I/Os) of the dies 325 may restrict and the number of die rotations, i.e., orientations allowed. For example, every rotation of a die can potentially misalign a set of I/Os of the die. In view of this, the mapping file is utilized for interposer fabrication and alignment purposes to allow for proper connections between the dies and interposer, regardless of the orientation or rotation of the dies and/or interposer. The dies 325 can also include a redistribution layer 342 on a backside of the die 325 to maintain connections to solder bumps during die rotation, as shown in FIG. 3D. This multi-way redistribution layer 342 can be pre-manufactured within the die 325. Further, the redistribution layer 342 can blow select connections post wafer rotation.

FIGS. 4A-4D illustrate various interposer configurations in accordance with aspects of the present disclosure. In accordance with the mapping file, the interposer 425 can have many different configurations, e.g., interconnects 430, to align with and connect the various via interconnects of the different dies used in the stack of dies. Although only two interconnects are shown, it should be understood by those of skill in the art that one or more interconnects can be utilized for the interposed depending on the desired design constraints. Additionally, the number of interposer configurations can be equal to an allowed number of die rotation configurations.

As further shown in FIGS. 4A-4D, the interconnects 430 can be arranged into various configurations which allow for die and/or interposer rotation and stacking in different orientations to maximize yield. That is, the different interposer configurations can contain different interconnect architectures to functionally connect dies with redundant via interconnects and other functional via interconnects into a 3D environment, regardless of the defects, rotation or orientation, etc. In addition, the interposers 425 can be rotated into different orientations to facilitate functional connections between the dies. For example, FIGS. 4A, 4B and FIGS. 4C, 4D are rotated by 180 degrees; although other orientations (rotations) are contemplated depending on the desired and/or required functional connections of the dies within the stack of dies. As should be understood by those of skill in the art, a benefit of rotating the interposers 425 is that fewer interposers 425 can be designed and implemented since the interposers 425 have the flexibility of being rotated to provide the required functional connection between adjacent dies in the stack of dies.

As further represented in FIGS. 4A-4D, as should be understood by those of skill in the art, the interposers 425 can be silicon or glass, amongst other examples. Additionally, in embodiments, the interposers 425 can include solder bumps 435 in electrical connection with the plurality of interconnects 430. The solder bumps can provide the required electrical connection between the via interconnects 330, 335 and 340 of the dies 325 and the interposers 425. These electrical connections facilitate functional connections between at least one defective die and another die in the 3D IC package.

FIG. 5 illustrates an exemplary look-up table detailing information for each die and interposer in accordance with aspects of the present disclosure. This look-up table can include, amongst other information: (i) die identification, (ii) classification, (iii) defect location, (iv) redundancy location (location of redundant via interconnect), (v) interposer matched to the die, and (v) rotation. For example, die #1 is classified as KGD1, which indicates defects in the left side of the die. The defects of die #1, i.e. defective vias, are found in areas or regions 1, 3 and 5, while the redundant vias have been added to regions 12, 15 and 18. For die #1 to be utilized in a 3D stack, interposer #1 is selected. Further, die #1 will not be rotated, i.e., 0°. In comparison, die #2 will use the same interposer, i.e., interposer #1, but will be rotated 180°, i.e., will be in the orientation of die 350. Accordingly, the look-up table can be used to match the interposer to the different dies, in addition to show a proper rotation of the dies and/or interposer amongst other features.

Figure 6:
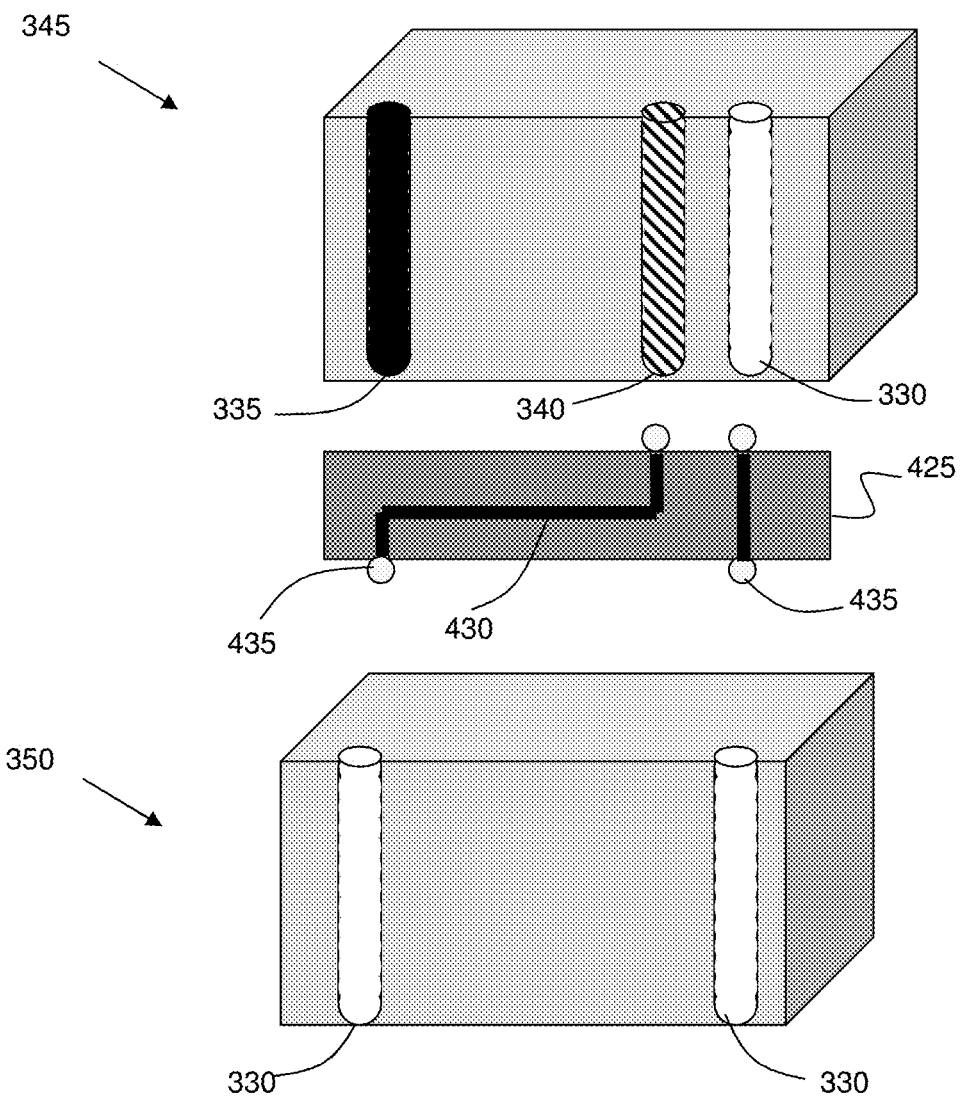
FIG. 6 shows a stack of dies with at least one interposer in accordance with aspects of the present disclosure.

FIG. 6 shows a stack of dies with at least one interposer in accordance with aspects of the present disclosure. More particularly, FIG. 6 shows the stacking of the selected interposer 425, the first die 345 and the second die 350 into a stack and bonding them together. In this illustrative example, the die 345 (first die) is a partially defective die with one operable or functional via interconnect (non-defective) 330, a defective via interconnect 335 and a functionally equivalent redundant via interconnect 340 to compensate for the defective via interconnect 335; whereas, the die 350 (second die) includes functional via interconnects 330. As should be understood by those of skill in the art, the defective via interconnect 335 of die 345 should be connected to one of the functional via interconnects 330 of die 350; however, due to the defect, this is not possible in a conventional implementation.

Instead, as shown representatively and in accordance with the present disclosure, the die 345 is rotated 180 degrees so that the operable or functional via interconnect 330 and the functionally equivalent redundant via interconnect 340 aligns with the interconnects 430 of the interposer 425. As shown in FIG. 6, the functional via interconnect 330 of the second die 350 is in misalignment with the functionally equivalent redundant via interconnect 340 of the first die 345, while another functional via interconnect 330 of the second die 350 is in alignment with the functional via interconnect 330 of the first die 345. However, by using the interposer 425, the interposer 425 provides electrical contact between the at least one functional via interconnect 330 and the at least one functionally equivalent redundant via interconnect 340.

Particularly, FIG. 6 shows the interposer 425 having electrical interconnections 430 coinciding with the least one functional via interconnect 330 of the die 350 and the at least one functionally equivalent redundant via interconnect 340 of the die 345, the interposer 425 being positioned between the dies 345, 350 such that the electrical interconnections 430 align with and provide electrical contact with the at least one functional via interconnect 330 and the at least one functionally equivalent redundant via interconnect 340. Similarly, the functional via interconnects 330 of the die 350 are also aligned with the interconnects 430 of the interposer 425. In this way, the solder bumps (connections) 435 for each of the interconnects 430 of the interposer 425 can be used to bond the dies 345, 350 together resulting in a functional stacked device by having the interconnects 430 of the interposer 425 match at least the redundant functional via interconnect 340 of the first die 345 and the functional via interconnect 330 of the second die 350, or vice versa, in the stack of dies. Regardless of the arrangement, the defective via interconnect 335 will remain unconnected.

Figure 7:
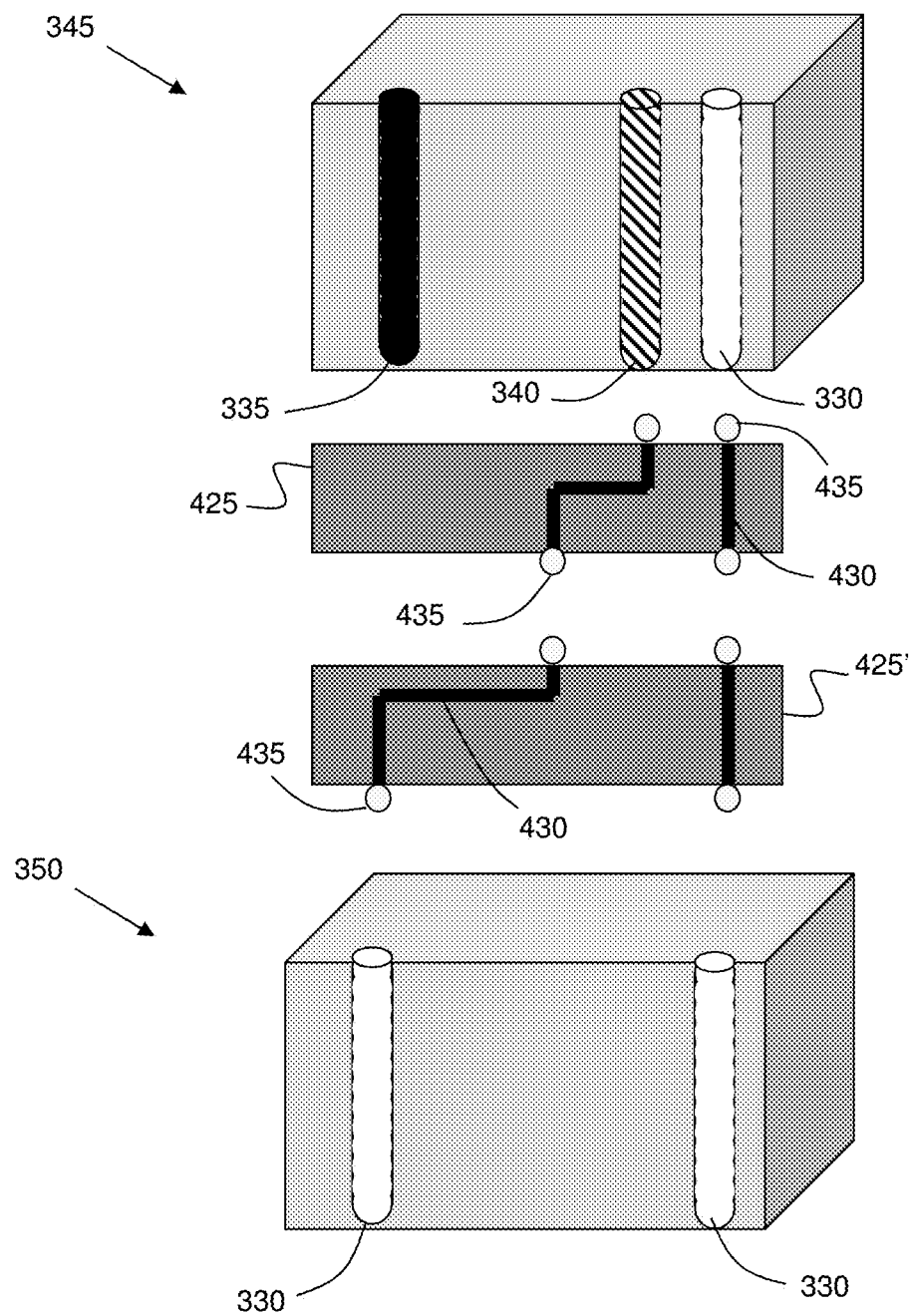
FIG. 7 shows a stack of dies with at least two interposers in accordance with aspects of the present disclosure.

FIG. 7 shows a stack of dies with at least two interposers in accordance with aspects of the present disclosure. As represented in FIG. 7, first interposer 425 and second interposer 425' can be used together to bond together the dies 345, 350 resulting in a functional stacked device. Accordingly, it should be understood that multiple interposers 425 can be mixed and matched together to facilitate the connections between the functional via interconnects between the different dies. As shown in FIG. 7, the second interposer 425' can be bonded to an opposing side of the second die 350, or the second interposer 425' can be bonded to an opposing side of the first die 345, for example. Additionally, the first interposer 425 can be bonded to an opposing side of the first die 345, or the first interposer 425 can be bonded to an opposing side of the second die 350, for example.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   at least one die comprising a plurality of via interconnects, the plurality of via interconnects comprising at least one functional via interconnect, one defective via interconnect and one redundant functional via interconnect to compensate for the one defective via interconnect; and
   an interposer which includes interconnects that aligns to and electrically connects at least one functional via interconnect and a redundant functional via interconnect of a different die when the interposer is oriented in a predetermined orientation, wherein the interconnects of the interposer are directly connected by solder bumps to the at least one functional via interconnect of the at least one die and the redundant functional via interconnect of the different die.

2. The structure of claim 1, wherein the interposer is a glass interposer.

3. The structure of claim 1, wherein the interposer is a silicon interposer.

4. The structure of claim 1, wherein:
   the at least one die is a first die and the different die is a second die in a stack of dies, and
   the interconnects of the interposer match to the at least one functional via interconnect of the first die and the redundant functional via interconnect of the second die of the stack of dies.

5. The structure of claim 4, wherein the redundant functional via interconnect of the second die of the stack of dies is a functional via interconnect.

6. The structure of claim 4, wherein the interconnects of the interposer match to the at least one functional via interconnect of the first die and the redundant functional via interconnect of the second die in a first orientation.

7. The structure of claim 6, wherein the interconnects of the interposer match to the at least one functional via interconnect of the first die and the redundant functional via interconnect of the second die in a second orientation.

8. The structure of claim 4, further comprising a second interposer comprising second interconnects, wherein the second interconnects match to the redundant functional via interconnect of the first die and the redundant functional via interconnect of the second die.

9. The structure of claim 8, wherein the second interposer is bonded to an opposing side of the first die in relation to the interposer.

10. The structure of claim 1, wherein the at least one die is rotated 180 degrees so that the at least one functional via interconnect and the at least one functionally equivalent redundant via interconnect align with the interconnects of the interposer.

11. The structure of claim 10, wherein the solder bumps bond the at least one die with the different die to form a functional stacked device.

12. The structure of claim 11, wherein the at least one defective via interconnect remains unconnected.

13. A structure, comprising:
a stack of dies comprising:
    a first die comprising at least one functional via interconnect; and
    a second die comprising at least one defective via interconnect which is in alignment with the at least one functional via interconnect of the first die and at least one functionally equivalent redundant via interconnect in misalignment to the at least one functional via interconnect of the first die; and
an interposer comprising electrical interconnections directly connected by solder connections to the least one functional via interconnect of the first die and the at least one functionally equivalent redundant via interconnect of the second die, the interposer being positioned between the first die and the second die such that the electrical interconnections align with and provide electrical contact with the at least one functional via interconnect of the first die and the at least one functionally equivalent redundant via interconnect.

14. The structure of claim 13, wherein the interposer is a glass interposer.

15. The structure of claim 13, wherein the interposer is a silicon interposer.

16. The structure of claim 13, wherein the at least one functionally equivalent redundant via interconnect, the at least one functional via interconnect and the at least one defective via interconnect are through silicon vias.

17. The structure of claim 13, wherein the interposer is a plurality of interposers comprising at least one additional interposer configured to functionally connect with the at least one functionally equivalent redundant via interconnect on an opposing side of the second die to the interposer.

18. The structure of claim 13, wherein the at least one additional interposer includes solder connections for connecting the at least one additional interposer to the interposer.

19. The structure of claim 13, wherein at least one electrical interconnect of the electrical interconnections of the interposer match to the at least one functional via interconnect of the first die and the at least one functionally equivalent redundant via interconnect of the second die in a first orientation.

20. The structure of claim 13, wherein the at least one electrical interconnect of the interposer match to the at least one functional via interconnect of the first die and the at least one functionally equivalent redundant via interconnect of the second die in a second orientation.

* * * * *